US012785633B2

United States Patent

(12) United States Patent
Tanaka et al.

(10) Patent No.: US 12,785,633 B2
(45) Date of Patent: Nov. 3, 2026

(54) COMBINER CIRCUIT

(71) Applicant: Murata Manufacturing Co., Ltd., Kyoto (JP)

(72) Inventors: Yuki Tanaka, Kyoto (JP); Shohei Imai, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 687 days.

(21) Appl. No.: 18/192,802

(22) Filed: Mar. 30, 2023

(65) Prior Publication Data

US 2023/0318546 A1 Oct. 5, 2023

(30) Foreign Application Priority Data

Mar. 31, 2022 (JP) ................................ 2022-061052

(51) Int. Cl.
*H03F 3/21* (2006.01)
*H03F 1/02* (2006.01)
*H03F 1/56* (2006.01)
*H03F 3/45* (2006.01)

(52) U.S. Cl.
CPC ........... *H03F 3/211* (2013.01); *H03F 1/0288* (2013.01); *H03F 1/565* (2013.01); *H03F 3/45475* (2013.01); *H03F 2200/387* (2013.01); *H03F 2200/451* (2013.01)

(58) Field of Classification Search
CPC ........ H03F 3/211; H03F 1/0288; H03F 1/565; H03F 3/45475; H03F 2200/387; H03F 2200/451; H03F 2200/537; H03F 2200/541; H03F 3/193; H03F 1/56; H03F 3/217
USPC .......................................................... 330/252
See application file for complete search history.

(56) References Cited

U.S. PATENT DOCUMENTS

2012/0218041 A1* 8/2012 Mineyama ............. H03F 1/347 330/277
2016/0006400 A1* 1/2016 Mu ....................... H03F 1/0288 330/295
2017/0085228 A1* 3/2017 Abdo ...................... H03F 1/301
2021/0384867 A1* 12/2021 Imai ...................... H03F 1/0288

FOREIGN PATENT DOCUMENTS

JP 2021-192476 A 12/2021

* cited by examiner

*Primary Examiner* — Jessica Han
*Assistant Examiner* — Jose E Pinero
(74) *Attorney, Agent, or Firm* — McDonald Hopkins LLC

(57) ABSTRACT

A combiner circuit includes: a combiner section that outputs a combined signal by combining a first signal output from a carrier amplifier circuit and a second signal output from a peak amplifier circuit, the first signal being generated by amplifying a first distribution signal distributed from an input signal, the second signal being generated by amplifying a second distribution signal distributed from the input signal; and a matching section connected in series with the combiner section to receive the combined signal, wherein a variation coefficient of an imaginary part of impedance associated with an increase in frequency of the input signal indicates a negative value, and the matching section matches impedance between the combiner section and a load.

11 Claims, 7 Drawing Sheets

| | | VARIATION COEFFICIENT A OF REAL PART [non-dim.] | | | | |
|---|---|---|---|---|---|---|
| | | -1 | -0.5 | 0 | 0.5 | 1 |
| VARIATION COEFFICIENT B OF IMAGINARY PART [non-dim.] | 1 | 12 | 14.2 | 16.1 | 18 | 16.4 |
| | 0 | 12.7 | 15.6 | 18.1 | 16.1 | 17 |
| | -1 | 13.3 | 17.4 | *20.6* | *23.2* | 17.2 |
| | -5 | 14.9 | *25.3* | *29.1* | *21.1* | 16.9 |
| | -9 | 15.3 | *28* | *29.9* | *19.4* | 16.5 |
| | -10 | 15.3 | *28* | *30* | *19.4* | 16.4 |
| | -11 | 15.3 | *28* | *29.9* | *19.4* | 16.4 |
| | -14 | 15.4 | *27.5* | *28.6* | *19.3* | 16.4 |
| | -17 | 15.3 | 15.9 | *28.2* | 17.5 | 15.9 |
| | -18 | 12.5 | *25.8* | *27.1* | 17.5 | 15.6 |
| | -19 | 8.9 | 10.3 | 13.1 | 14.5 | 14 |

COMBINER CIRCUIT

CROSS REFERENCE TO RELATED APPLICATION

This application claims priority from Japanese Patent Application No. 2022-061052 filed on Mar. 31, 2022. The content of this application is incorporated herein by reference in its entirety.

BACKGROUND ART

The present disclosure relates to a combiner circuit.

The Doherty amplifier is a highly efficient power amplifier. Generally in the Doherty amplifier, a carrier amplifier that operates regardless of the power level of the input signal and a peak amplifier that is turned off when the power level of the input signal is small and turned on when it is large are connected in parallel. In the case where the power level of the input signal is large, the carrier amplifier operates while maintaining saturation at the saturated output power level. That is, in the back-off state where only the carrier amplifier is performing amplification, since only the carrier amplifier operates, the peak amplifier does not consume unnecessary current and the efficiency increases. In addition, there is a load modulation effect in which the impedance of the carrier amplifier is reduced to half in the range of input power from the minimum power at which the peak amplifier operates to the saturation state. Since the saturated output power of the carrier amplifier is inversely proportional to the load impedance, the saturated power of the carrier amplifier increases with an increase in the output power of the output of the peak amplifier due to the effect of load modulation. In other words, in the power range where the peak amplifier is operating, the carrier amplifier always operates close to the saturation power, and it can be said that it operates highly efficiently. That is, the effect of load modulation is an suitable effect for achieving high-efficiency operation of the Doherty amplifier.

Moreover, the Doherty amplifier requires a combiner that combines the output of the carrier amplifier and the output of the peak amplifier. Where a ¼ wavelength line is used for the combiner, a ¼ wavelength line is not suitable for achieving miniaturization and broader bandwidth characteristics. Therefore, there is disclosed a Doherty amplifier that does not use a ¼ wavelength line (see, for example, Japanese Unexamined Patent Application Publication (JP-A) No. 2021-192476).

A combiner circuit of a power amplifier circuit described in JP-A No. 2021-192476 is configured using two transformers without necessarily using a ¼ wavelength line. This allows for miniaturization and broader bandwidth characteristics of the Doherty amplifier. However, yet broader bandwidth is demanded as technology advances.

BRIEF SUMMARY

The present disclosure provides a broader-bandwidth combiner circuit in a Doherty amplifier without necessarily using a ¼ wavelength line.

A combiner circuit according to an aspect of the present disclosure includes: a combiner section that outputs a combined signal by combining a first signal output from a carrier amplifier circuit and a second signal output from a peak amplifier circuit, the first signal being generated by amplifying a first distribution signal distributed from an input signal, the second signal being generated by amplifying a second distribution signal distributed from the input signal; and a matching section connected in series with the combiner section to receive the combined signal, wherein a variation coefficient of an imaginary part of impedance associated with an increase in frequency of the input signal indicates a negative value, and the matching section matches impedance between the combiner section and a load.

According to the present disclosure, a broader-bandwidth combiner circuit can be provided in the Doherty amplifier without necessarily using a ¼ wavelength line.

DETAILED DESCRIPTION

Power Amplifier Circuit 100 According to First Embodiment

Figure 1:
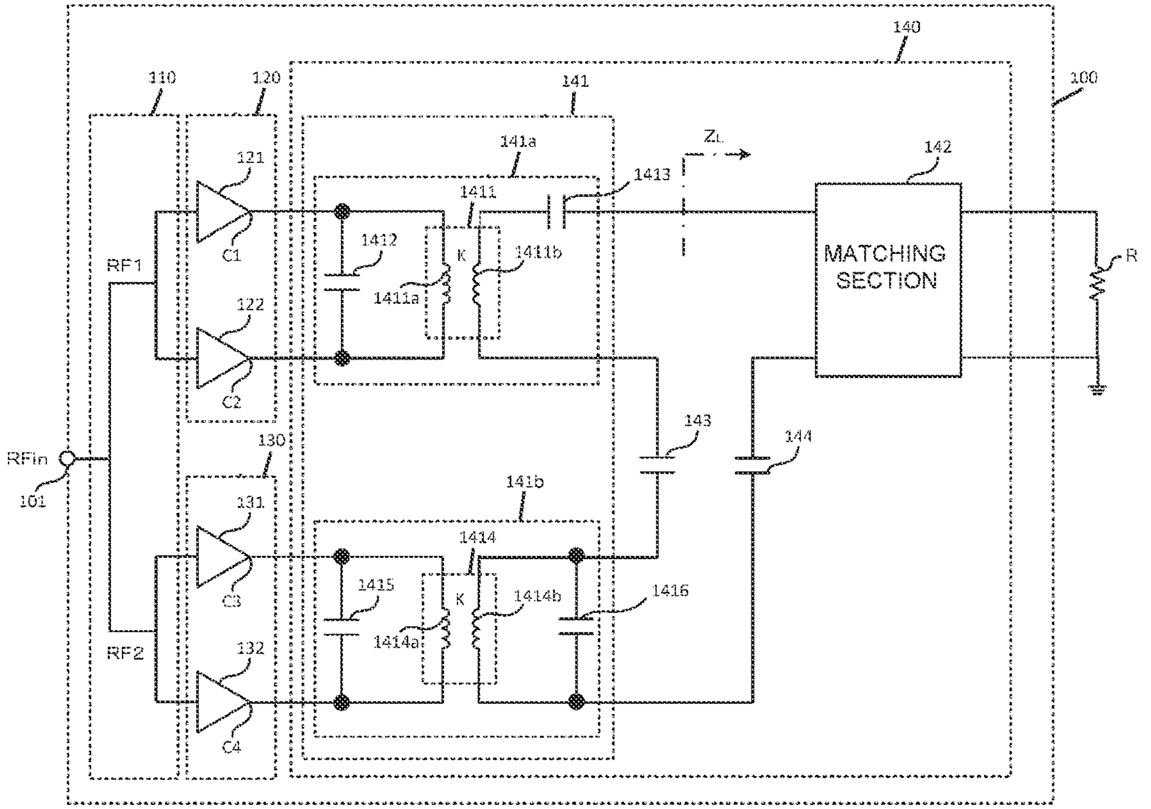
FIG. 1 is a diagram illustrating a schematic configuration of a power amplifier circuit according to a first embodiment.

Referring to FIG. 1, the configuration of a power amplifier circuit 100 according to a first embodiment will be described. FIG. 1 is a diagram illustrating a schematic configuration of the power amplifier circuit 100 according to the first embodiment.

The power amplifier circuit 100 is mounted on a mobile phone, for example, and is used to amplify the power of signals transmitted to a base station. The power amplifier circuit 100 can amplify the power of signals of communication standards, such as 2G (2nd generation mobile communication system), 3G (3rd generation mobile communication system), 4G (4th generation mobile communication system), 5G (5th generation mobile communication system), LTE (Long Term Evolution)-FDD (Frequency Division Duplex), LTE-TDD (Time Division Duplex), LTE-Advanced, and LTE-Advanced Pro. Note that the communication standards of signals amplified by the power amplifier circuit 100 are not limited to the above.

The power amplifier circuit 100 forms a Doherty amplifier circuit, for example, and amplifies an input signal RFin input from an input terminal 101 and outputs an output signal RFout. The input signal RFin is a radio frequency (RF) signal, and the frequency of the input signal RFin is about several GHz, for example.

As illustrated in FIG. 1, the power amplifier circuit 100 includes, for example, a distributor 110, a carrier amplifier circuit 120, a peak amplifier circuit 130, and a combiner circuit 140. Hereinafter, each component will be described.

The distributor 110 distributes, for example, the input signal RFin into a signal RF1 and a signal RF2 whose phase is approximately 90 degrees ahead of the signal RF1. Approximately 90 degrees includes, for example, a phase of 45 degrees to 135 degrees. Note that, in the present embodiment, since the carrier amplifier circuit 120 and the peak amplifier circuit 130 are differential amplifier circuits as an example, the signals RF1 and RF2 are each further distributed into two input signals having a phase difference of approximately 180 degrees. Approximately 180 degrees includes, for example, a phase of 135 degrees to 225 degrees.

The carrier amplifier circuit 120 amplifies the signal RF1 and outputs an amplified signal. The carrier amplifier circuit 120 may include, for example, a carrier amplifier 121 and a carrier amplifier 122 to constitute a differential amplifier circuit. Note that the carrier amplifier circuit 120 may be composed of a single amplifier. Hereinafter, the carrier amplifier circuit 120 will be described as a differential amplifier circuit as an example.

The peak amplifier circuit 130 amplifies the input signal RF2 and outputs an amplified signal. The peak amplifier circuit 130 may include, for example, a peak amplifier 131 and a peak amplifier 132 to constitute a differential amplifier circuit. Note that the peak amplifier circuit 130 may be composed of a single amplifier. Hereinafter, the peak amplifier circuit 130 will be described as a differential amplifier circuit as an example. Note that the peak amplifier circuit 130 may be configured by connecting a plurality of circuits in series.

A differential amplifier circuit includes two paired amplifiers, and amplifies and outputs the potential difference between signals having the same amplitude and opposite phase that are input to the respective two amplifiers. Therefore, when signals having the same amplitude and the same phase (such as noise) are simultaneously input to the two amplifying elements, these signals having the same amplitude and the same phase are canceled out. That is, the use of differential amplifiers for the carrier amplifier circuit 120 and the peak amplifier circuit 130 can suppress the generation of noise and harmonic waves of the input signal.

The amplifier elements provided in each differential amplifier are not particularly limited, but may be bipolar transistors such as heterojunction bipolar transistors (HBT) or field-effect transistors such as MOSFET (Metal-oxide-Semiconductor Field Effect Transistor).

In the power amplifier circuit 100, as an example, the carrier amplifier circuit 120 operates in class AB, and the peak amplifier circuit 130 operates in class C. That is, the carrier amplifier circuit 120 operates in the region where the power level is zero (first level) or higher regardless of the power level of the input signal RFin. The peak amplifier circuit 130 operates in the region where the voltage level of the input signal RFin is greater than or equal to back-off, which is a level lower than the maximum level Vmax by a certain level. Note that the peak amplifier circuit 130 may be, for example, an amplifier circuit that operates in class AB at a bias level different from that of the carrier amplifier circuit 120.

By combining the operations of the two amplifiers according to the power level of the input signal as above, the region in which the carrier amplifier circuit 120 operates with a saturated output expands. Therefore, power efficiency is improved as compared with a power amplifier circuit composed of only one amplifier circuit.

The combiner circuit 140 includes, for example, a combiner section 141, a matching section 142, a capacitor 143, and a capacitor 144. Note that the combiner circuit 140 is electrically connected in series with the carrier amplifier circuit 120, the peak amplifier circuit 130, and a load R.

The combiner section 141 outputs, for example, a combined signal by combining the amplified signal output from the carrier amplifier circuit 120 and the amplified signal output from the peak amplifier circuit 130. The combiner section 141 includes, for example, a converter **141*a* and a converter 141*b***.

The converter **141*a* is electrically connected with an output terminal of the carrier amplifier circuit 120. The converter 141*b* is electrically connected with an output terminal of the peak amplifier circuit 130. The converters 141*a* and 141*b* convert, for example, characteristics (impedance, phase, etc.) pertaining to the respective amplifier circuits 120 and 130**, and transmit the amplified power to the load R.

By substantially converting the characteristics (impedance, phase, etc.) pertaining to the amplifier elements composing the respective amplifier circuits 120 and 130 using the converters **141*a* and 141*b*, when each of the amplifier circuits 120 and 130 is viewed from the load R side, whether each of the amplifier circuits 120 and 130 can be regarded as a current source or a voltage source is adjusted. Whether each of the amplifier circuits 120 and 130 can be regarded as a current source or a voltage source is determined by a relative comparison of the absolute value of the output impedance of each of the amplifier circuits 120 and 130. Here, the output impedance may be calculated based on a reflection coefficient obtained from a traveling wave and a reflected wave measured from the load R side when transistors of the amplifier circuits 120 and 130** are biased with no idle current flowing.

The power amplifier circuit 100 is configured so that the carrier amplifier circuit 120 side can be regarded as a current source due to the converter **141*a*, and the peak amplifier circuit 130 side can be regarded as a voltage source due to the converter 141*b*. That is, the converter 141*a* and the converter 141*b* make the absolute value of the impedance on the output side of the carrier amplifier circuit 120 (output side of the converter 141*a*) larger than the absolute value of the impedance on the output side of the peak amplifier circuit 130 (output side of the converter 141*b***).

Here, an example of the configuration of the converter **141*a* and the converter 141*b*** will be described.

The converter **141*a* includes, for example, a first transformer 1411, a first capacitor 1412, and a second capacitor 1413**.

The first transformer 1411 is, for example, a winding transformer that includes an input-side winding **1411*a* and an output-side winding 1411***b*, and propagates a signal input to the input-side winding 1411*a* to the output-side winding 1411*b*. Specifically, in the first transformer 1411, an amplified signal RF11 (current Ia) output from the carrier amplifier circuit 120 is input to the input-side winding 1411*a*, which in turn is output from the output-side winding 1411*b*. Note that the first transformer 1411 can also serve the function of impedance matching by adjusting the winding ratio of the input-side winding 1411*a* and the output-side winding 1411*b*.

The first capacitor 1412 is connected in parallel with the input-side winding 1411*a*, for example. The second capacitor 1413 is directly connected with the output-side winding 1411*b*, for example. The first capacitor 1412 and the second capacitor 1413 are provided for impedance matching of the first transformer 1411 in the case where, for example, the effect of the parasitic inductance of the first transformer 1411 is considered. Note that the first capacitor 1412 may be omitted because it can be replaced with capacitance parasitic to the carrier amplifier circuit 120.

The converter 141*b* includes, for example, a second transformer 1414, a third capacitor 1415, and a fourth capacitor 1416. The second transformer 1414, the third capacitor 1415, and the fourth capacitor 1416 are the same as or similar to the first transformer 1411, the first capacitor 1412, and the second capacitor 1413, respectively, and thus descriptions thereof are omitted. Note that, in the converter 141*b*, the fourth capacitor 1416 is electrically connected in parallel with an output winding 1414*b*, in place of the second capacitor 1413 in the converter 141*a*.

The power amplifier circuit 100 is configured so that the output impedance of the converter 141*a* when viewed from the load R side will be greater than the output impedance of the converter 141*b* when viewed from the load R side. Therefore, in the power amplifier circuit 100, the converter 141*a* is relatively regarded as a current source and the converter 141*b* is relatively regarded as a voltage source.

That is, in the power amplifier circuit 100, since the carrier amplifier circuit 120 side can be regarded as a current source and the peak amplifier circuit 130 side can be regarded as a voltage source, the current flowing into the load R is determined only by the current source. Therefore, in the power amplifier circuit 100, the output impedance viewed from the amplifier elements of the carrier amplifier circuit 120 can be appropriately reduced to half with the transition from the small signal state to the saturated state of the carrier amplifier circuit 120 without necessarily using a ¼ wavelength line. Accordingly, a smaller and broader-bandwidth Doherty amplifier can be realized, as well as its high efficiency can be realized.

Furthermore, the use of differential amplifiers in the power amplifier circuit 100 makes it possible to realize a circuit that is robust against power supply noise. Additionally, this can result in a simplified bias circuit and a circuit with excellent linearity.

Note that the power amplifier circuit 100 may be composed of, for example, a single amplifier for the first stage (driver stage) and the above-described Doherty amplifier circuit for the output stage (power stage). Moreover, the power amplifier circuit 100 may also have an amplifier, which is a first stage (driver stage), connected with each of the carrier amplifier circuit 120 and the peak amplifier circuit 130 of the output stage (power stage).

The matching section 142 matches the impedance with the load. The matching section 142 is a circuit in which the imaginary part of the impedance indicates a negative value. The primary side of the matching section 142, the secondary side of the converter 141*a*, and the secondary side of the converter 141*b* are electrically connected in series. The secondary side of the matching section 142 is electrically connected with the load R.

The capacitor 143 is a capacitor for adjusting the characteristics of the combiner section 141. One of two ends of the capacitor 143 is electrically connected with the output-side winding 1411*b* of the converter 141*a*. The other end of the capacitor 143 is electrically connected with an output-side winding 1414*b* of the converter 141*b*. That is, the capacitor 143 is electrically connected in series between the converter 141*a* and the converter 141*b*.

The capacitor 144 is a capacitor for adjusting the characteristics of the combiner section 141. One of two ends of the capacitor 144 is electrically connected with the output-side winding 1414*b* of the converter 141*b*. The other end of the capacitor 144 is electrically connected with the matching section 142. That is, the capacitor 144 is electrically connected in series between the converter 141*b* and the matching section 142.

Note that the combiner circuit 140 need not necessarily include the capacitor 143 and the capacitor 144, or may include only one of the capacitor 143 or the capacitor 144. In addition, the combiner circuit 140 may be provided with ground in place of either the capacitor 143 or the capacitor 144. This allows for broader bandwidth and miniaturization of the circuit.

Figure 2:
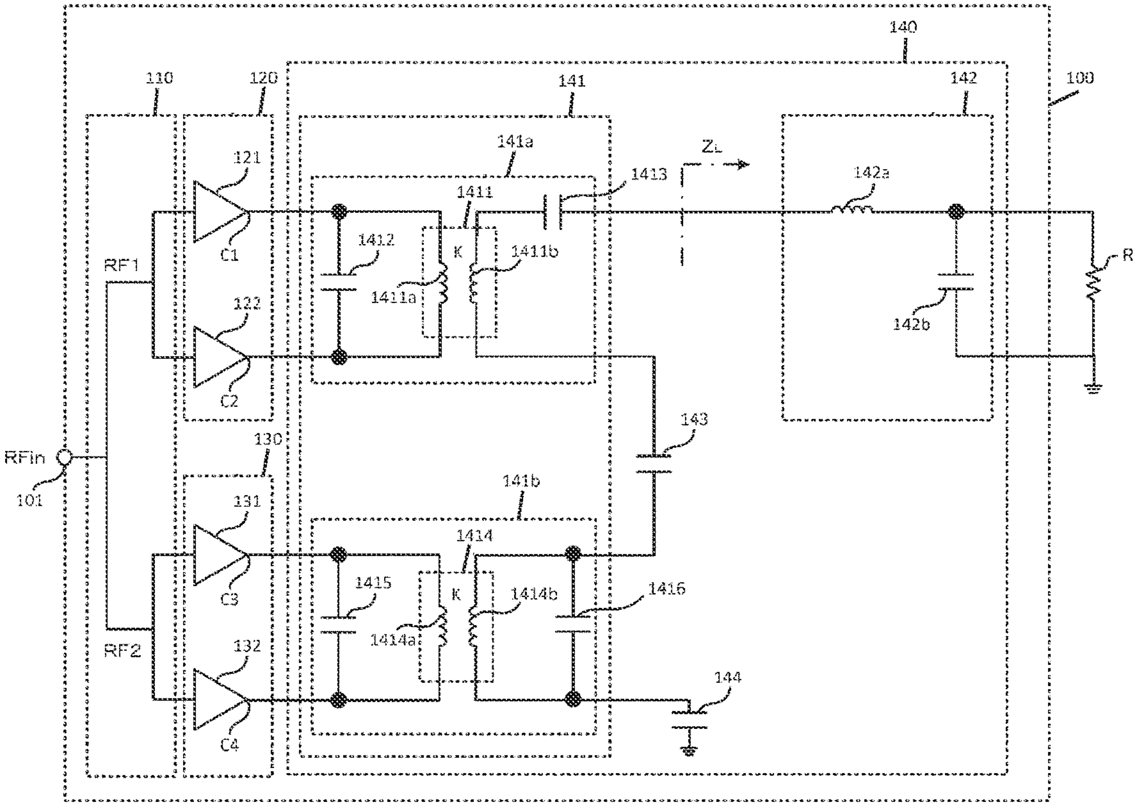
FIG. 2 is a diagram illustrating an example of the configuration of a matching section.
Figure 3:
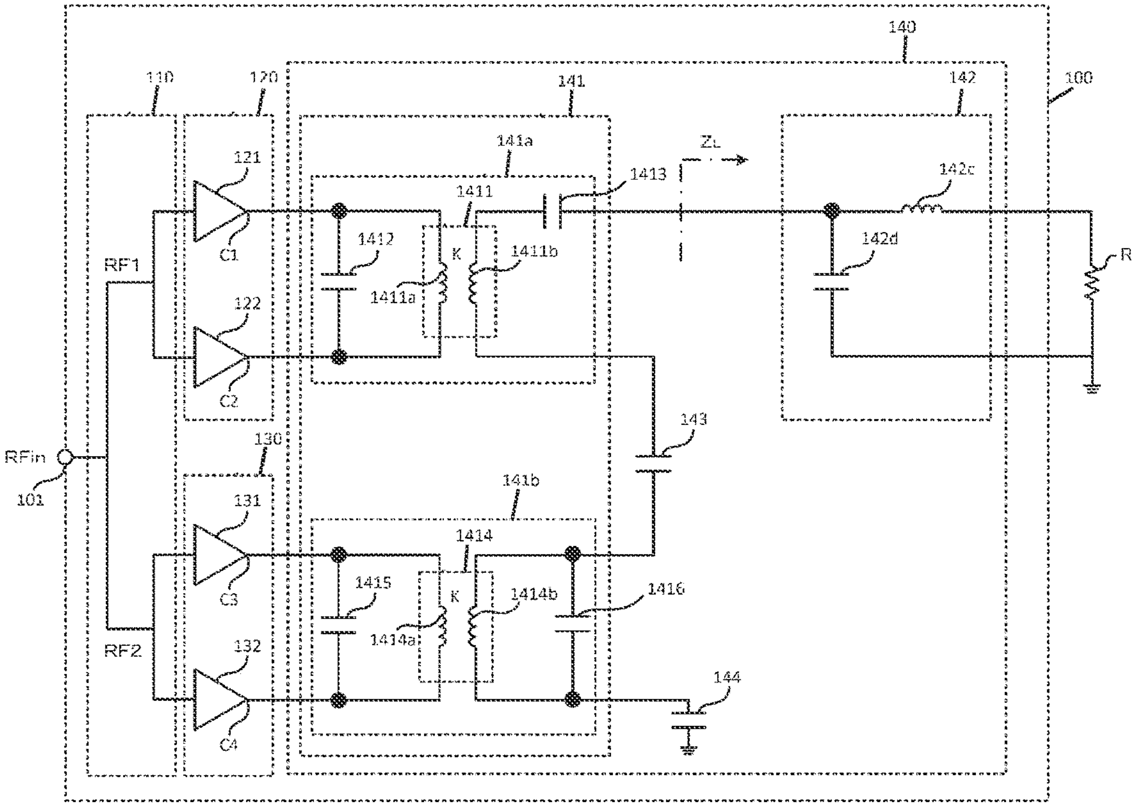
FIG. 3 is a diagram illustrating an example of the configuration of the matching section.
Figure 4:
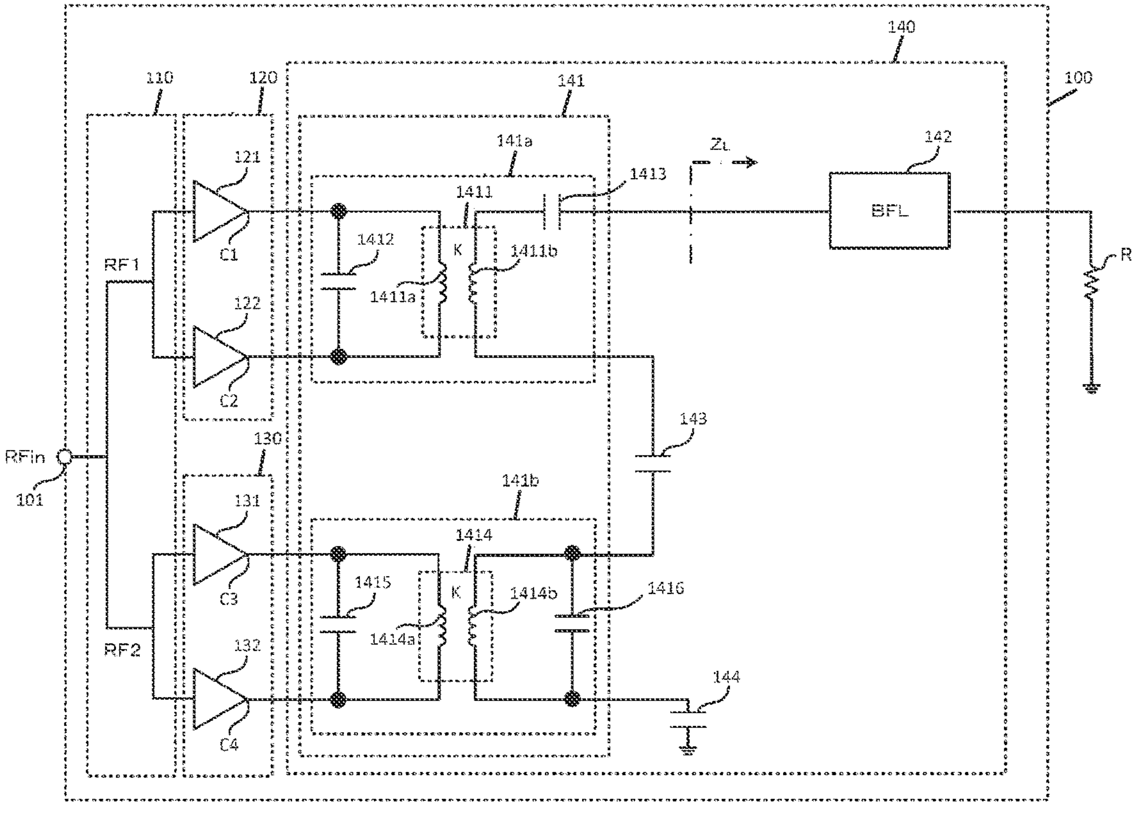
FIG. 4 is a diagram illustrating an example of the configuration of the matching section.

Next, specific examples of the configuration of the matching section 142 will be described with reference to FIG. 2, FIG. 3, and FIG. 4. FIG. 2, FIG. 3, and FIG. 4 are diagrams each illustrating an example of the configuration of the matching section 142.

As illustrated in FIG. 2, the matching section 142 may be a low-pass filter formed of an inductor 142*a* and a capacitor 142*b*. One of two ends of the inductor 142*a* is electrically connected with the output-side winding 1411*b* with the second capacitor 1413 interposed therebetween. The other end of the inductor 142*a* is electrically connected with the load R. The capacitor 142*b* is electrically connected in parallel with the load R. That is, the matching section 142 illustrated in FIG. 2 is a circuit that converts impedance to a larger value. Note that the matching section 142 illustrated in FIG. 2 may be a single-stage low-pass filter or a multiple-stage low-pass filter. This allows for broader bandwidth with a simple configuration.

Note that, in FIG. 2, the second capacitor 1413 may be omitted by adjusting the inductance of the inductor 142*a*. This allows for miniaturization of the circuit.

As illustrated in FIG. 3, the matching section 142 may be a low-pass filter formed of an inductor 142*c* and a capacitor 142*d*. One of two ends of the inductor 142*c* is electrically connected with the output-side winding 1411*b* with the second capacitor 1413 interposed therebetween. The other end of the inductor 142*c* is electrically connected with the load R. The capacitor 142*d* is electrically connected in parallel with the inductor 142*c* and the load R. That is, the matching section 142 illustrated in FIG. 3 is a circuit that converts impedance to a smaller value. Note that the matching section 142 illustrated in FIG. 3 may be a single-stage low-pass filter or a multiple-stage low-pass filter. This allows for broader bandwidth with a simple configuration.

As illustrated in FIG. 4, the matching section 142 may be a bandpass filter formed of an inductor and a capacitor. As the bandpass filter, one provided in an antenna to which the power amplifier circuit 100 is connected may be utilized. This allows for broader bandwidth as well as miniaturization of the circuit with a simple configuration.

Next, the frequency characteristics of the impedance of the combiner circuit 140 will be described, with reference to FIG. 5 to FIG. 10, in which the frequency variation (or a variation coefficient indicating the direction of the frequency variation) of the imaginary part of the impedance associated with an increase in frequency of the input signal RFin in the matching section 142 indicates a negative value.

In the power amplifier circuit 100, in the combiner circuit 140, the frequency variation associated with an increase in frequency of the input signal RFin of the imaginary part of the impedance of the matching section 142 (the frequency variation associated with an increase in frequency of the input signal RFin of the imaginary part of impedance $Z_L$ described later) indicates a negative value so as to cancel out the frequency variation of the impedance of the combiner section 141 associated with an increase in frequency of the input signal RFin. That is, in the power amplifier circuit 100, the combiner circuit 140 is configured so that the frequency variation of the impedance of the combiner section 141 and the frequency variation of the impedance $Z_L$ when the load side is viewed from the output terminal of the combiner section 141 cancel each other out. In the power amplifier circuit 100, the frequency variation of the impedance viewed from the input terminal of the combiner section 141 can be reduced by canceling out the frequency variation of the impedance of the combiner section 141. This can reduce variations in return loss due to the frequency of the input signal RFin. In doing so, broader bandwidth of the power amplifier circuit 100 can be realized. Note that return loss refers to, for example, power loss at output terminals C1 to C4 of the carrier amplifier circuit 120 and the peak amplifier circuit 130. Note that the case where the frequency variation associated with an increase in frequency of the input signal RFin of the imaginary part of the impedance $Z_L$ or the variation coefficient indicates a negative value includes, but is not limited to, the case where a later-described variation coefficient B is a negative value, for example.

In the power amplifier circuit 100, the frequency characteristics of the impedance of the combiner circuit 140 are set so that the frequency variation of the impedance of the combiner section 141 and the frequency variation of the impedance $Z_L$ cancel each other out. First, the definition of the frequency range and the method for approximating the frequency characteristics of the real part of the impedance $Z_L$, which are necessary for identifying the frequency characteristics of the impedance of the matching section 142, will be described.

First, the frequency range will be described. The frequency range is the range between a frequency $f_{max}$ and a frequency $f_{min}$ that satisfy the following equation (1) and equation (2), where the frequency of the input signal RFIn is denoted as $f_{in}$.

$$\frac{f_{max} + f_{min}}{2} = F_{in} \quad \text{equation (1)}$$

$$\frac{f_{max} - f_{min}}{F_{in}} \leq 0.491 \quad \text{equation (2)}$$

In equation (1) and equation (2), the frequency $f_{max}$ and the frequency $f_{min}$ are frequencies that are arbitrarily determined with respect to the frequency $f_{in}$. In addition, "0.491" in equation (2) is the fractional bandwidth assuming the coupling coefficient of the converter 141*a* and the converter 141*b* in the combiner section 141 is at its maximum (such as "1"). The fractional bandwidth is a value obtained by dividing the frequency range by the frequency $f_{in}$ of the input signal RFin.

Figures 5, 6:
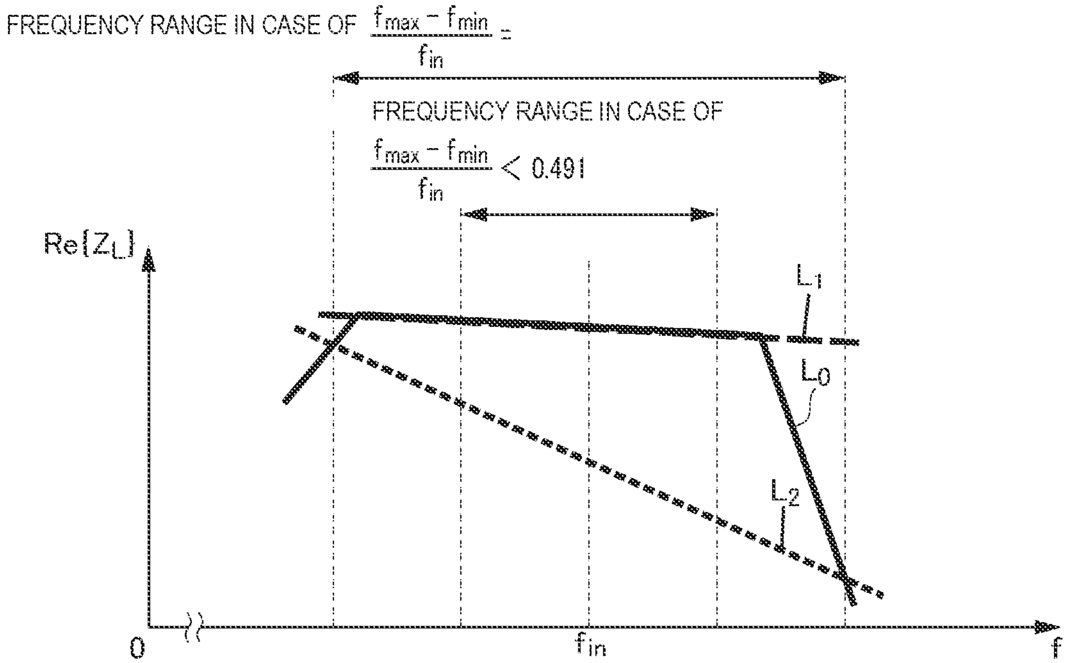
FIG. 5 is a graph representing the approximate line when the fractional bandwidth is less than "0.491" and the approximate line when the fractional bandwidth is "0.491"
FIG. 6 is a table representing the relationship of a variation coefficient A and a variation coefficient B with the fractional bandwidth.

Referring to FIG. 5, the reason for setting the fractional bandwidth to be less than "0.491" as in equation (2) will be described. FIG. 5 is a graph representing the approximate line when the fractional bandwidth is less than "0.491" and the approximate line when the fractional bandwidth is "0.491". FIG. 5 represents frequency f on the horizontal axis, and the value of the real part $Re(Z_L)$ of the impedance $Z_L$ on the vertical axis.

As illustrated in FIG. 5, with respect to $L_0$ indicating the frequency variation of the real part, the approximate line when the fractional bandwidth is less than 0.491 is denoted by $L_1$, and the approximate line L2 when the fractional bandwidth is 0.491 is denoted by $L_2$. In other words, $L_1$ is a line approximating the variation of the value of the real part $Re(Z_L)$ of the impedance $Z_L$ with respect to frequency for the case where the left side of equation (2) is less than "0.491", and $L_2$ is a line approximating the variation of the value of the real part $Re(Z_L)$ of the impedance $Z_L$ with respect to frequency for the case where the left side of equation (2) is "0.491". As illustrated in FIG. 5, the slope of the approximate line $L_1$ for the case where the fractional bandwidth is less than "0.491" is gentler than the slope of the approximate line $L_2$ for the case where the fractional bandwidth is "0.491". That is, when the fractional bandwidth is less than "0.491", the slope of the approximate line indicating the frequency variation of the real part (variation coefficient A described later) becomes extremely small, making it more likely to meet the conditions derived from FIG. 6 described later. Therefore, in equation (2), the condition that the fractional bandwidth is less than 0.491 is assumed.

Next, the method for approximating the frequency characteristics of the real part of the impedance $Z_L$ will be described. Let $Re\{Z_L(f_{min})\}$ and $Re\{Z_L(f_{max})\}$ respectively be the real part of the impedance $Z_L$ at the lower limit frequency $f_{min}$ and the upper limit frequency $f_{max}$, which indicate the frequency range of the input signal RFin (the real part of the impedance $Z_L$ in the case where the signal RFin at the frequency $f_{min}$ and the signal RFin at the frequency $f_{max}$ are transmitted to the power amplifier circuit 100). In addition, let $Im\{Z_L(f_{min})\}$ and $Im\{Z_L(f_{max})\}$ respectively be the imaginary part of the impedance $Z_L$ at the frequency $f_{min}$ and the upper limit frequency $f_{max}$ (the imaginary part of the impedance $Z_L$ in the case where the signal RFin at the frequency $f_{min}$ and the signal RFin at the frequency $f_{max}$ are transmitted to the power amplifier circuit 100). In that case, the variation coefficient A indicating the slope of the approximate line of the real part is obtained by equation (3), and the variation coefficient B indicating the slope of the approximate line of the imaginary part is obtained by equation (4). That is, the variation coefficient A indicates the slope of the frequency characteristics of the real part of the impedance $Z_L$, and the variation coefficient B indicates the slope of the frequency characteristics of the imaginary part of the impedance $Z_L$.

$$A = \frac{\dfrac{\mathrm{Re}\,|Z_L(f_{max})| - \mathrm{Re}\,|Z_L(f_{min})|}{R_{in}}}{\dfrac{f_{max} + f_{min}}{f_{in}}} \quad \text{equation (3)}$$

-continued $$B = \frac{\frac{\text{Im}\,|Z_L(f_{max})| - \text{Im}\,|Z_L(f_{min})|}{R_{in}}}{\frac{f_{max} + f_{min}}{f_{in}}} \quad \text{equation (4)}$$

Note that $R_{in}$ in equation (3) and equation (4) is the value of the real part $\text{Re}(Z_L)$ of the impedance $Z_L$ when the frequency of the input signal RFin is $f_{in}$.

Next, the range of values for each of the variation coefficient A and the variation coefficient B for achieving broader bandwidth of the power amplifier circuit 100 will be described. Hereinafter, for convenience, a circuit not including the matching section 142 according to the present embodiment will be described as a conventional power amplifier circuit (not illustrated) as a comparison target with the power amplifier circuit 100.

In the method for approximating the frequency characteristics, let $\text{Re}(Z_L)$ be the real part and $\text{Im}(Z_L)$ be the imaginary part of the frequency characteristics of the impedance $Z_L$. Then, $\text{Re}(Z_L)$ and $\text{Im}(Z_L)$ are approximated as in equation (5) and equation (6).

$$\text{Re}\,(Z_L) = \text{Re}\left(A\frac{f_{in} - f_0}{f_0} + 1\right) \quad \text{equation (5)}$$

$$\text{Im}\,(Z_L) = \text{Re}\left(B\frac{f_{in} - f_0}{f_0}\right) \quad \text{equation (6)}$$

Note that $f_0$ is the design center frequency of the combiner circuit 140 (the frequency set as fin, which is the center frequency of the frequency range at the time of design). Also, $R_0$ in equation (5) and equation (6) is $\text{Re}(Z_L)$ at the frequency $f_0$.

Referring now to FIG. 6, the relationship of the variation coefficient A and the variation coefficient B with the fractional bandwidth (the ratio of the frequency range divided by the frequency $f_0$) will be described. Note that the fractional bandwidth is the same as the fractional bandwidth defined in equation (2), "the value obtained by dividing the frequency range by the frequency $f_{in}$ of the input signal RFin", except that $f_0$ is a frequency set at the time of design, and $f_{in}$ is the frequency of the input signal RFin actually input to the power amplifier circuit 100. FIG. 6 is a table representing the relationship of the variation coefficient A and the variation coefficient B with the fractional bandwidth. Note that the fractional bandwidth represented in FIG. 6 is, as an example, the value when a coupling coefficient K of the converter 141*a* and the converter 141*b* is set to "0.65".

The fractional bandwidth "18.1" when (A, B) in FIG. 6 is (0, 0) is the fractional bandwidth of the conventional power amplifier circuit. That is, it can be evaluated that, in the power amplifier circuit 100, it is necessary that the variation coefficient A and the variation coefficient B indicate a fractional bandwidth greater than the fractional bandwidth 18.1. Therefore, the combination of the variation coefficient A and the variation coefficient B in FIG. 6 is a combination corresponding to the fractional bandwidth of a thick frame in FIG. 6.

That is, bandwidth broader than the conventional power amplifier circuit can be achieved when the combination of the variation coefficient A and the variation coefficient B is such that the variation coefficient A is within the range $-1.0$[non-dim.]$<A<1.0$[non-dim.] and the variation coefficient B satisfies the condition $-19.0$[non-dim.]$<B<0.0$[non-dim.].

In other words, broader bandwidth of the power amplifier circuit 100 can be achieved when the real part of the impedance $Z_L$ has a small variation with respect to frequency, and the imaginary part of the impedance $Z_L$ has a negative variation with respect to frequency. That is, broader bandwidth can be achieved by connecting the combiner circuit 140 in which the frequency variation of the imaginary part is negative.

From the above, broader bandwidth of the power amplifier circuit 100 as compared with the conventional power amplifier circuit can be achieved when the combiner circuit 140 is configured such that, in the frequency range satisfying equation (1) and equation (2) (specifically, the lower limit frequency $f_{min}$ and the upper limit frequency $f_{max}$ satisfying equation (1) and equation (2)), the variation coefficient A and the variation coefficient B, obtained by equation (3) and equation (4), are within the range $-1.0$[non-dim.]$<A<1.0$[non-dim.] and satisfy the condition $-19.0$[non-dim.]$<B<0.0$[non-dim.].

Specifically, referring to FIG. 7, FIG. 8, FIG. 9, and FIG. 10, as an example, how broader bandwidth of the power amplifier circuit 100 illustrated in FIG. 1 can be achieved when the frequency $f_{in}$ of the input signal RFin is set to 3.75 GHz, and the frequency range is set such that the frequency $f_{min}$ is set to 3.41 GHz and the frequency $f_{max}$ is set to 4.09 GHz will be described. Here, the frequency range satisfies equation (2) because $(f_{max}-f_{min})/f_{in}$ is "0.18".

Figure 7:
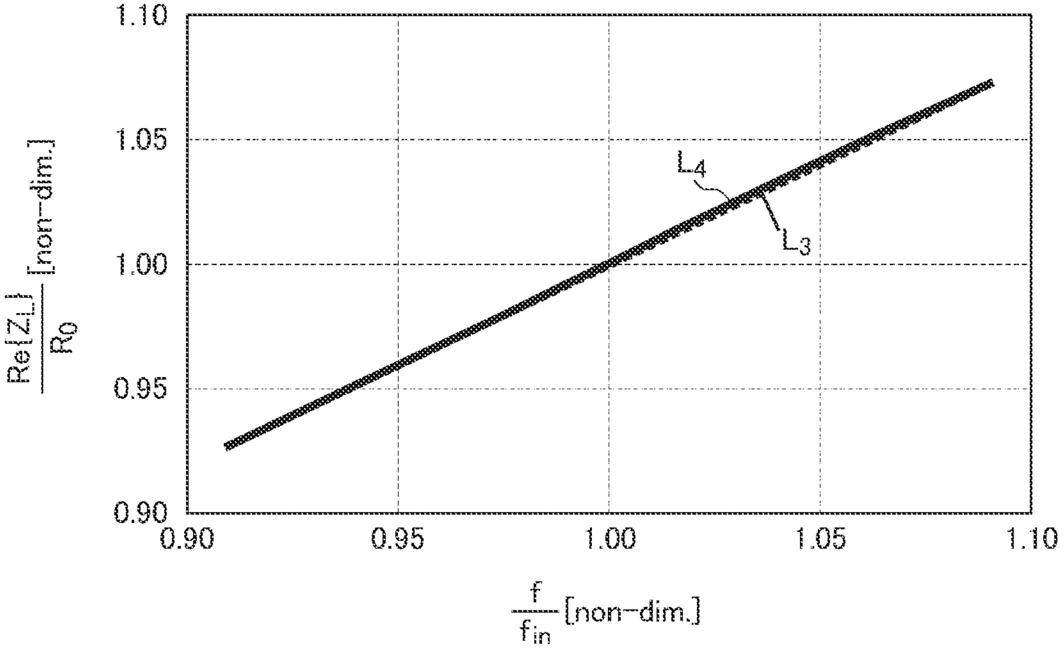
FIG. 7 is a graph representing the approximate line for the simulation result of the real part of impedance $Z_L$ in a frequency range.

FIG. 7 is a graph representing the approximate line for the simulation result of the real part of the impedance $Z_L$ in the frequency range. FIG. 7 represents the value obtained by dividing the frequency by the frequency $f_{in}$ of the input signal on the horizontal axis, and the value obtained by dividing the real part $\text{Re}(Z_L)$ of the impedance $Z_L$ at each frequency by $R_0$, which is $\text{Re}(Z_L)$ at the design center frequency $f_0$ of the combiner circuit 140, on the vertical axis.

As indicated by a dashed approximate line $L_3$ in FIG. 7, the frequency characteristics of the real part of the impedance $Z_L$ exhibit a tendency to increase linearly as the frequency increases. Note that, in FIG. 7, the approximate line $L_3$ is an approximate line based on the simulation result represented by solid line $L_4$.

Figure 8:
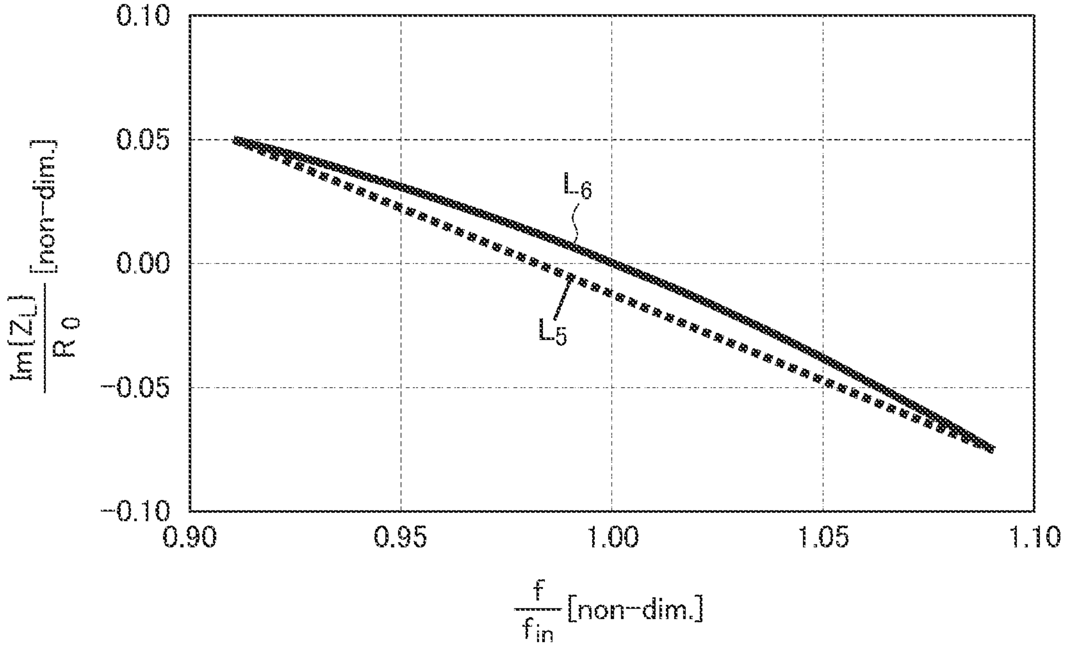
FIG. 8 is a graph representing the approximate line for the simulation result of the imaginary part of the impedance $Z_L$ in the frequency range.

In contrast, FIG. 8 is a graph representing the approximate line for the simulation result of the imaginary part of the impedance $Z_L$ in the frequency range. FIG. 8 represents the value obtained by dividing a certain frequency by the frequency $f_{in}$ of the input signal on the horizontal axis, and the value obtained by dividing the imaginary part $\text{Im}(Z_L)$ of the impedance $Z_L$ at the certain frequency by $R_0$, which is $\text{Re}(Z_L)$ at the design center frequency $f_0$ of the combiner circuit 140, on the vertical axis.

As indicated by a dashed approximate line $L_5$ in FIG. 8, the frequency characteristics of the imaginary part of the impedance $Z_L$ exhibit a tendency to decrease linearly as the frequency increases. Note that, in FIG. 8, the approximate line $L_5$ is an approximate line based on the simulation result represented by solid line $L_6$.

Based on equation (3) and equation (4), the variation coefficient A for the frequency range is "0.79", and the variation coefficient B is "−0.69". That is, within the range $-1.0$[non-dim.]$<A<1.0$[non-dim.], the condition $-19.0$[non-dim.]$<B<0.0$[non-dim.] is satisfied. Note that [non-dim.] indicates, for example, non-dimensional (without necessarily any unit).

Figure 9:
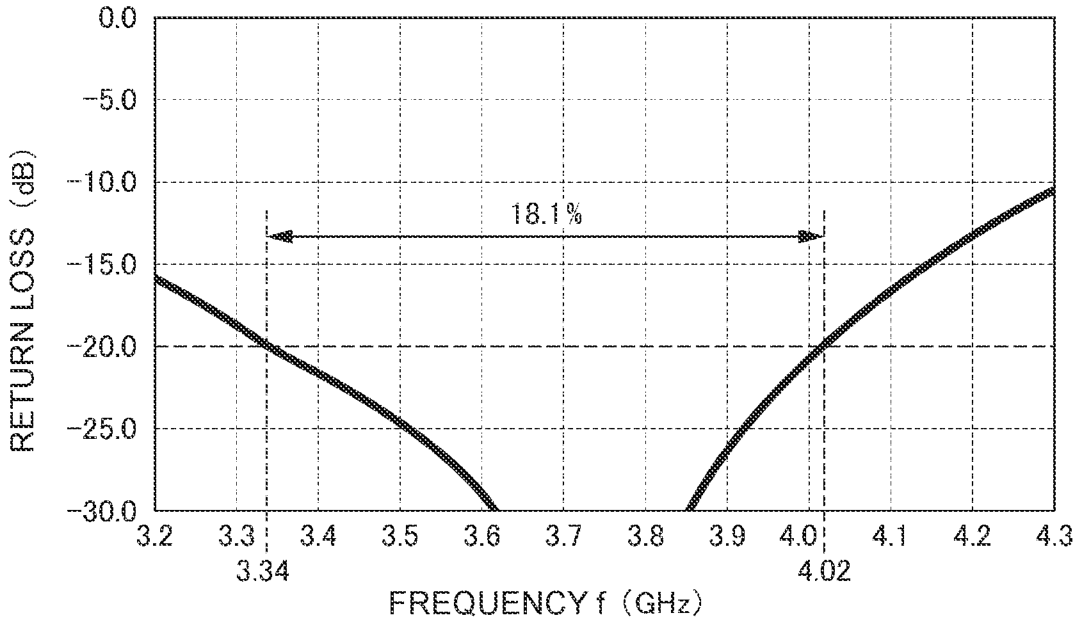
FIG. 9 is a graph representing the relationship between the return loss and frequency of a conventional power amplifier circuit.
Figure 10:
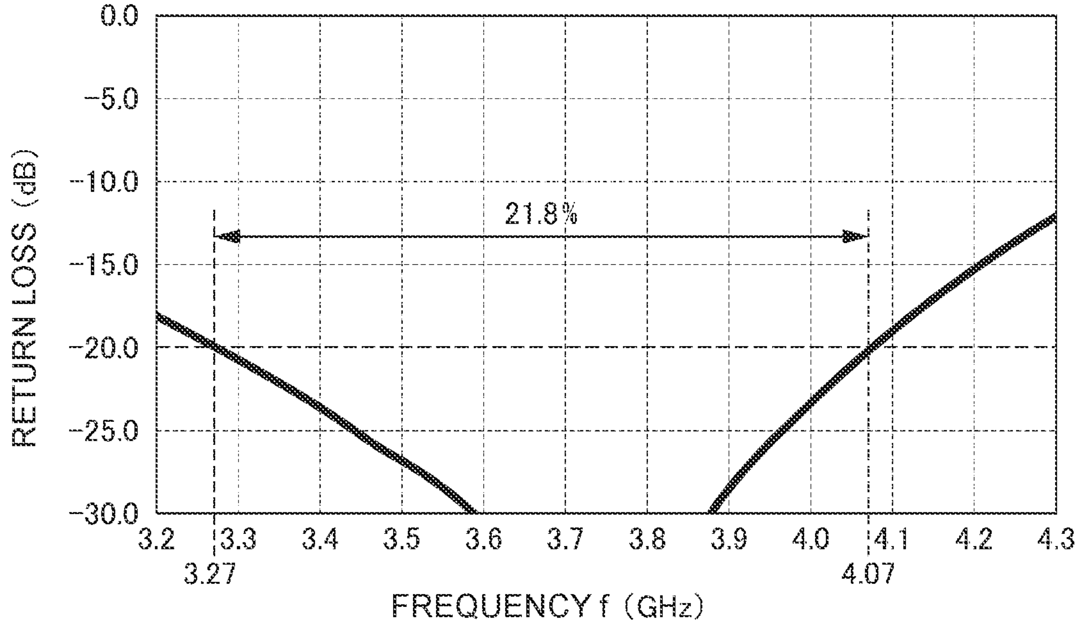
FIG. 10 is a graph representing the relationship between the return loss and frequency of the power amplifier circuit.

Then, with reference to FIG. 9 and FIG. 10, the return loss of the power amplifier circuit 100 is compared with the return loss of the conventional power amplifier circuit. FIG. 9 is a graph representing the relationship between the return loss and frequency of the conventional power amplifier circuit. FIG. 10 is a graph representing the relationship between the return loss and frequency of the power amplifier circuit 100. FIG. 9 and FIG. 10 represent return loss on the vertical axis and frequency on the horizontal axis. Note that the coupling coefficient of the converter 141*a* and the converter 141*b* is set to "0.65".

In general, when the return loss of a power amplifier circuit is "−20.0 dB" or less at a certain frequency, the power amplifier circuit having good characteristics is obtained because the deviation of the maximum output power of the power amplifier circuit at that frequency falls within 1 dB. As represented in FIG. 9, the frequency band in which the return loss of the conventional power amplifier circuit is "−20.0 dB" or less is from 3.34 GHz to 4.02 GHz. In contrast, as represented in FIG. 10, the frequency band in which the return loss of the power amplifier circuit 100 is "−20.0 dB" or less is from 3.27 GHz to 4.07 GHz. In this manner, broader bandwidth of the power amplifier circuit 100 can be achieved as compared with the conventional power amplifier circuit.

Power Amplifier Circuit 200 According to Second Embodiment

Figure 11:
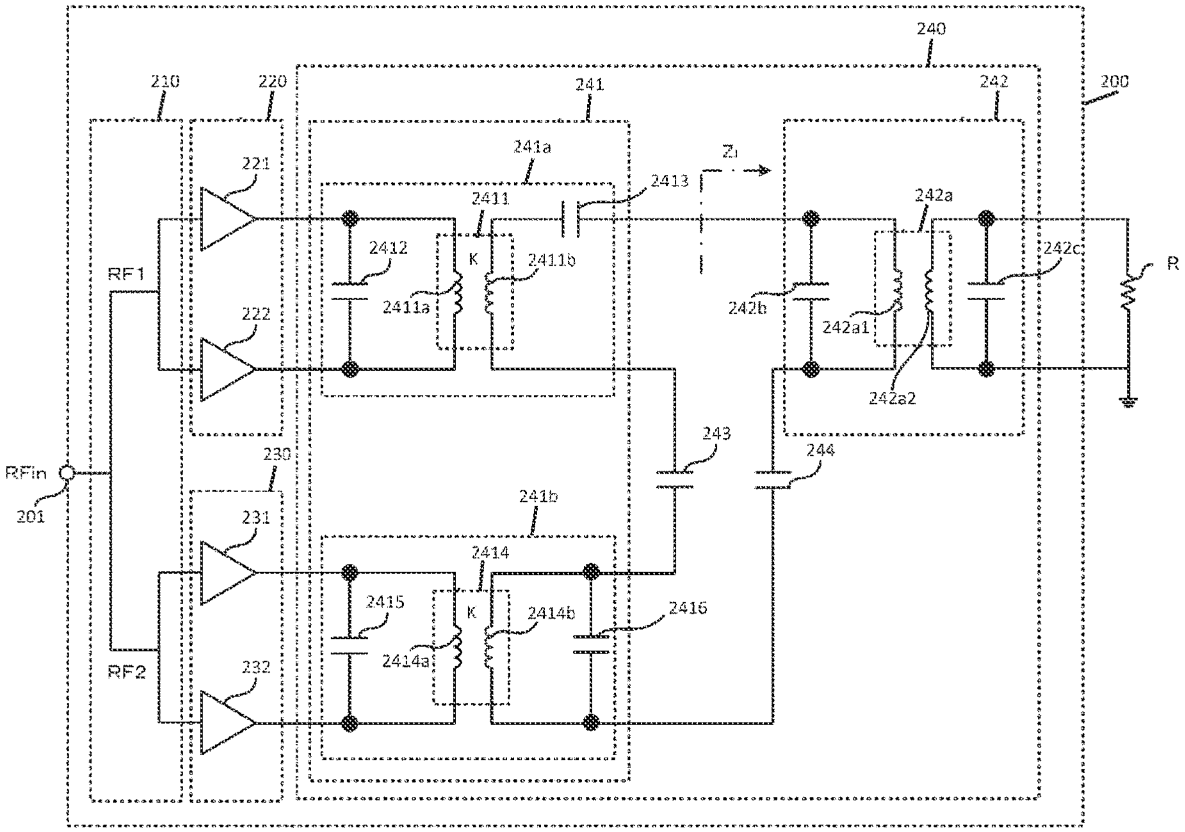
FIG. 11 is a diagram illustrating an example of the configuration of a power amplifier circuit according to a second embodiment.

Referring next to FIG. 11, a power amplifier circuit 200 according to a second embodiment will be described. FIG. 11 is a diagram illustrating an example of the configuration of the power amplifier circuit 200 according to the second embodiment. In the second embodiment, descriptions of matters common to the first embodiment will be omitted, and only differences will be described. In particular, the same or similar effects due to the same or similar configurations are not mentioned one by one.

As illustrated in FIG. 11, the power amplifier circuit 200 is such that, as compared with the power amplifier circuit 100, a matching section 242 includes a transformer 242*a*, a capacitor 242*b*, and a capacitor 242*c*.

The transformer 242*a* is, for example, a winding transformer that includes an input-side winding 242*a*1 and an output-side winding 242*a*2, and propagates a signal input to the input-side winding 242*a*1 to the output-side winding 242*a*2. Specifically, in the transformer 242*a*, a signal obtained by combining an amplified signal RF11 output from a carrier amplifier circuit 220 and an amplified signal RF21 output from a peak amplifier circuit 230 is input to the input-side winding 242*a*1, which in turn is output from the output-side winding 242*a*2.

The capacitor 242*b* is connected in parallel with the input-side winding 242*a*1, for example. The capacitor 242*c* is connected in parallel with the output-side winding 242*a*2, for example. The capacitor 242*b* and the capacitor 242*c* are provided for impedance matching of the transformer 242*a* in the case where, for example, the effect of the parasitic inductance of the transformer 242*a* is considered.

Broader bandwidth of the power amplifier circuit 200 than the power amplifier circuit 100 can be achieved. Hereinafter, as an example, how the power amplifier circuit 200 can achieve broader bandwidth will be specifically described.

Here, specifically, referring to FIG. 12, FIG. 13, and FIG. 14, as an example, the case in which, in the power amplifier circuit 200, the frequency $f_{in}$ of the input signal RFin is set to 3.90 GHz, and the frequency range is set such that the frequency $f_{min}$ is set to 3.50 GHz and the frequency $f_{max}$ is set to 4.30 GHz will be described. Here, the frequency range satisfies equation (2) because $(f_{max}-f_{min})/f_{in}$ is "0.18".

Figure 12:
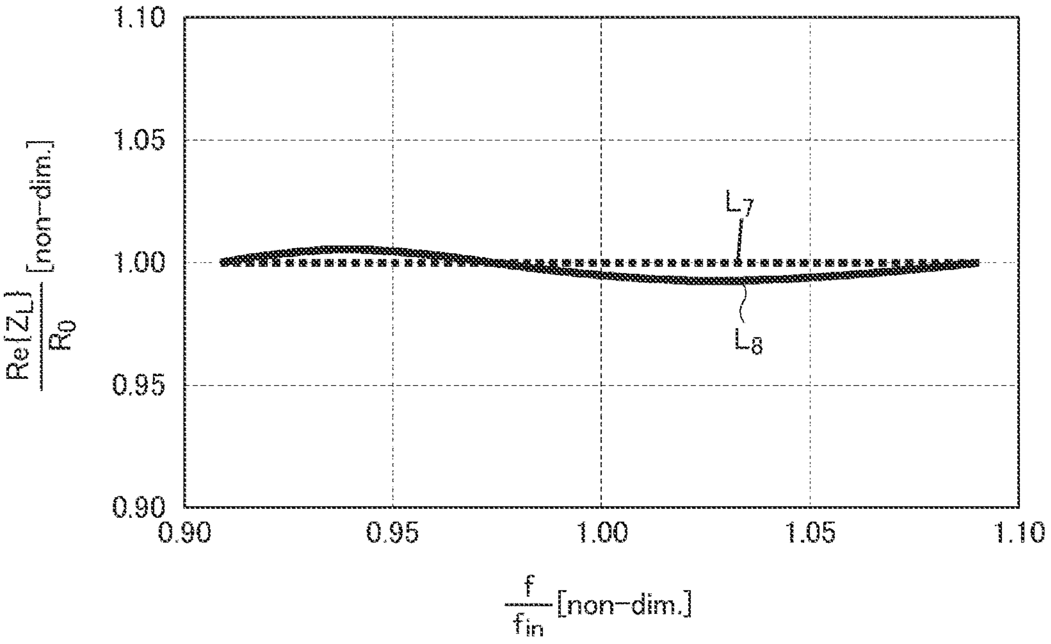
FIG. 12 is a graph representing the approximate line for the simulation result of the real part of the impedance $Z_L$ in the frequency range.

FIG. 12 is a graph representing the approximate line for the simulation result of the real part of the impedance $Z_L$ in the frequency range. FIG. 12 represents the value obtained by dividing frequency by the frequency $f_{in}$ of the input signal on the horizontal axis, and the value obtained by dividing the real part $Re(Z_L)$ of the impedance $Z_L$ at frequency by $R_0$, which is $Re(Z_L)$ at the design center frequency $f_0$ of the combiner circuit 140, on the vertical axis.

As indicated by a dashed approximate line $L_7$ in FIG. 12, the frequency characteristics of the real part of the impedance $Z_L$ are almost unchanged even if the frequency increases. Note that, in FIG. 12, the approximate line $L_7$ is an approximate line based on the simulation result represented by solid line $L_8$.

Figure 13:
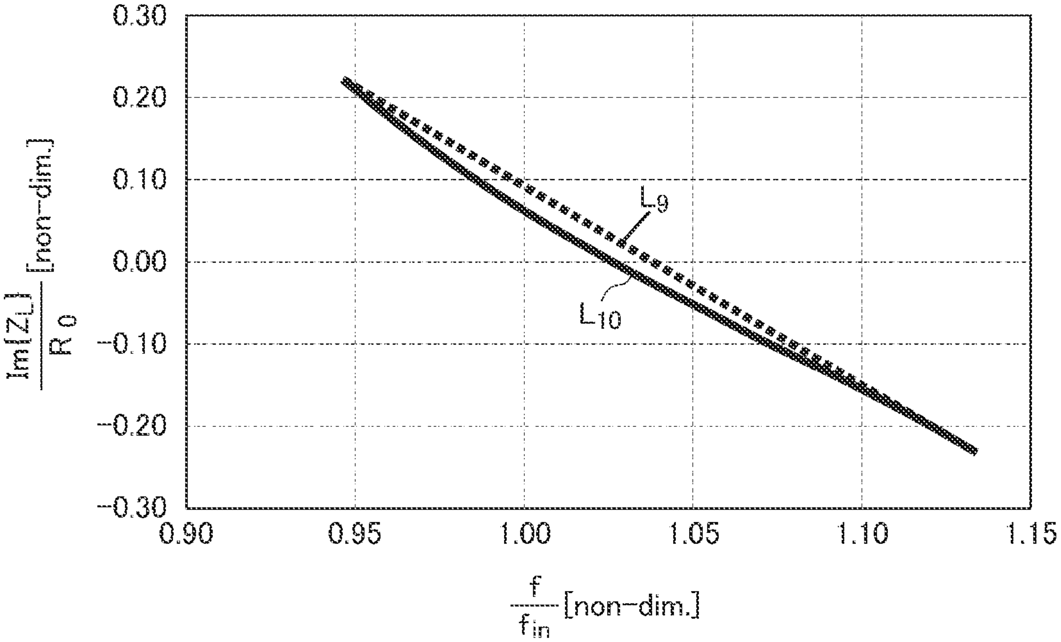
FIG. 13 is a graph representing the approximate line for the simulation result of the imaginary part of the impedance $Z_L$ in the frequency range.

FIG. 13 is a graph representing the approximate line for the simulation result of the imaginary part of the impedance $Z_L$ in the frequency range. FIG. 13 represents the value obtained by dividing a certain frequency by the frequency $f_{in}$ of the input signal on the horizontal axis, and the value obtained by dividing the imaginary part $Im(Z_L)$ of the impedance $Z_L$ at the certain frequency by $R_0$, which is $Re(Z_L)$ at the design center frequency $f_0$ of the combiner circuit 140, on the vertical axis.

As indicated by a dashed approximate line $L_9$ in FIG. 13, the frequency characteristics of the imaginary part of the impedance $Z_L$ exhibit a tendency to decrease linearly as the frequency increases. Note that, in FIG. 13, the approximate line $L_9$ is an approximate line based on the simulation result represented by solid line $L_{10}$.

Based on equation (3) and equation (4), the variation coefficient A for the frequency range is "−0.008", and the variation coefficient B is "−2.5". That is, within the range −1.0[non-dim.]<A<1.0[non-dim.], the condition −19.0[non-dim.]<B<0.0[non-dim.] is satisfied.

Then, referring to FIG. 14, the return loss of the power amplifier circuit 200 will be described. FIG. 14 is a graph representing the relationship between the return loss and frequency of the power amplifier circuit 200 according to the second embodiment. FIG. 14 represents return loss on the vertical axis and frequency on the horizontal axis. Note that the coupling coefficient of a converter 241*a* and a converter 241*b* is set to "0.65".

Figure 14:
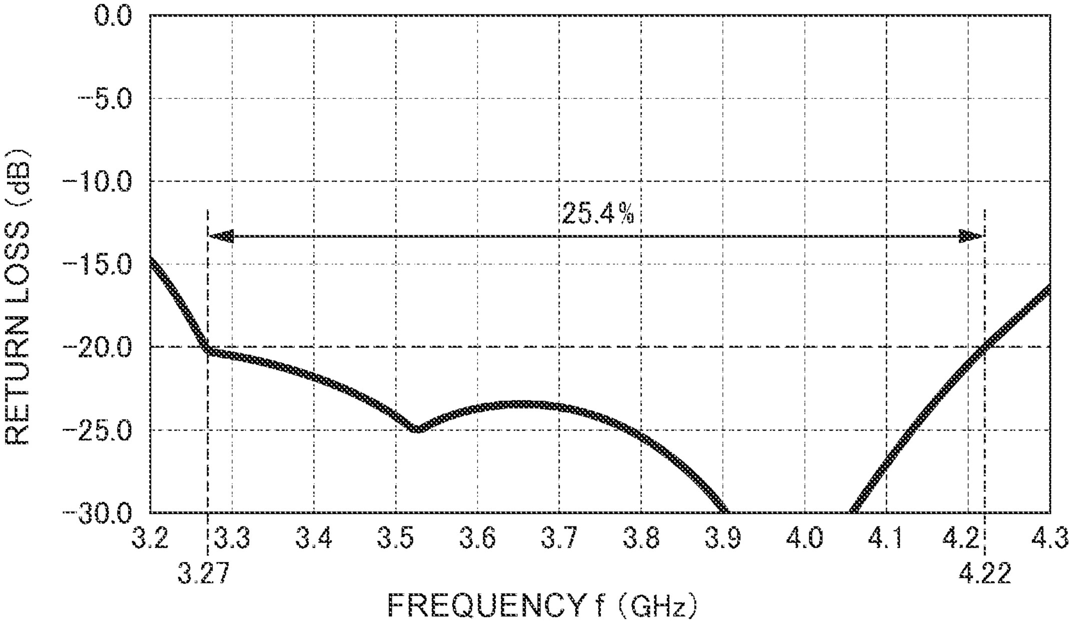
FIG. 14 is a graph representing the relationship between the return loss and frequency of the power amplifier circuit according to the second embodiment.

As indicated in FIG. 14, the frequency band in which the return loss of the power amplifier circuit 200 is "−20.0 dB" or less is from 3.27 GHz to 4.22 GHz. As described above, broader bandwidth of the power amplifier circuit 200 can be achieved as compared with the power amplifier circuit 100 (the frequency range is from 3.27 GHz to 4.07 GHz) and the conventional power amplifier circuit (the frequency range is from 3.34 GHz to 4.02 GHz).

CONCLUSION

The combiner circuit 140 according to an exemplary embodiment of the present disclosure includes: the combiner section 141 that outputs a combined signal by combining an amplified signal (first signal) output from the carrier amplifier circuit 120 and an amplified signal output from the peak amplifier circuit 130, the amplified signal (first signal) being generated by amplifying the signal RF1 (first distribution signal) distributed from the input signal RFin, the amplified signal output from the peak amplifier circuit 130 being generated by amplifying the signal RF2 (second distribution signal) distributed from the input signal RFin; and the matching section 142 connected in series with the combiner section 141 so as to receive the combined signal, wherein the variation coefficient B of the imaginary part of impedance associated with an increase in frequency of the input signal RFin indicates a negative value, and the matching section 142 matches impedance between the combiner section 141 and a load. This allows for broader bandwidth of the Doherty amplifier without necessarily using a ¼ wavelength line.

Additionally, the matching section 142 of the combiner circuit 140 according to an exemplary embodiment of the present disclosure is such that, when the frequency of the input signal RFin is denoted as a first frequency $f_{in}$, let the lower limit frequency, $f_{min}$, be a second frequency $f_{min}$, and the upper limit frequency, $f_{max}$, be a third frequency $f_{max}$, as obtained by equation (1) and equation (2); and, in the case where impedance when the load is viewed from the output side of the combiner section 141 is denoted as the impedance $Z_L$, let $R_{in}$ be the real part of the impedance at the first frequency $f_{in}$, $\mathrm{Re}\{Z_L(f_{min})\}$ be the real part of the impedance $Z_L$ at the second frequency $f_{min}$, $\mathrm{Im}\{Z_L(f_{min})\}$ be the imaginary part of the impedance $Z_L$ at the second frequency $f_{min}$, $\mathrm{Re}\{Z_L(f_{max})\}$ be the real part of the impedance $Z_L$ at the third frequency $f_{max}$, and $\mathrm{Im}\{Z_L(f_{max})\}$ be the imaginary part of the impedance $Z_L$ at the third frequency $f_{max}$; then, the variation coefficient A and the variation coefficient B, which are coefficients obtained by equation (3) and equation (4), satisfy the conditions of equation (5) and equation (6). This allows for broader bandwidth of the Doherty amplifier without necessarily using a ¼ wavelength line.

Also, the matching section 142 of the combiner circuit 140 according to an exemplary embodiment of the present disclosure includes a low-pass filter (see FIG. 2 and FIG. 3) that includes an inductor and a capacitor. This allows for broader bandwidth with a simple configuration.

Moreover, the matching section 142 of the combiner circuit 140 according to an exemplary embodiment of the present disclosure includes a bandpass filter (see FIG. 4) of which one of two terminals is electrically connected with the combiner section 141 and the other terminal is electrically connected with the antenna (not illustrated) on the opposite side of the combiner section 141. This allows for broader bandwidth as well as miniaturization of the circuit with a simple configuration.

In addition, the matching section 242 of the combiner circuit 240 according to an exemplary embodiment of the present disclosure includes: the transformer 242*a* (first transformer) including the input-side winding 242*a*1 (first input-side winding) to which a combined signal is input, and the output-side winding 242*a*2 (first output-side winding) which is electromagnetic-field coupled with the input-side winding 242*a*1 (first input-side winding); the capacitor 242*b* (first capacitor), which is a capacitor connected in parallel with the input-side winding 242*a*1 (first input-side winding); and the capacitor 242*c* (second capacitor), which is a capacitor connected in parallel with the output-side winding 242*a*2 (first output-side winding). This allows for broader bandwidth of the Doherty amplifier without necessarily using a ¼ wavelength line.

Furthermore, the carrier amplifier circuit 120 of the power amplifier circuit 100 according to an exemplary embodiment of the present disclosure forms a differential amplifier circuit with the carrier amplifier 121 (first carrier amplifier) and the carrier amplifier 122 (second carrier amplifier). Accordingly, that is, by using a differential amplifier for the carrier amplifier circuit 120, the generation of noise and harmonic waves of the input signal can be suppressed.

In addition, the peak amplifier circuit 130 of the power amplifier circuit 100 according to an exemplary embodiment of the present disclosure forms a differential amplifier circuit with the peak amplifier 131 (first peak amplifier) and the peak amplifier 132 (second peak amplifier). Accordingly, by using a differential amplifier for the peak amplifier circuit 130, the generation of noise and harmonic waves of the input signal can be suppressed.

In addition, the combiner section 141 of the combiner circuit 140 according to an exemplary embodiment of the present disclosure includes: the converter 141*a* (first converter) electrically connected with the output terminal of each of the carrier amplifier 121 (first carrier amplifier) and the carrier amplifier 122 (second carrier amplifier), the converter 141*a* (first converter) converting the impedance on the output side of the carrier amplifier 121 (first carrier amplifier) and the carrier amplifier 122 (second carrier amplifier); and the converter 141*b* (second converter) electrically connected with the output terminal of each of the peak amplifier 131 (first peak amplifier) and the peak amplifier 132 (second peak amplifier), the converter 141*b* (second converter) converting the impedance on the output side of the peak amplifier 131 (first peak amplifier) and the peak amplifier 132 (second peak amplifier). Accordingly, a small and broader-bandwidth Doherty amplifier can be realized, as well as its high efficiency can be realized.

Also, the converter 141*a* (first converter) of the combiner circuit 140 according to an exemplary embodiment of the present disclosure includes: the first transformer 1411 (second transformer) including the input-side winding 1411*a* (second input-side winding) of which one of two ends is electrically connected with the carrier amplifier 121 (first carrier amplifier) and the other end is electrically connected with the carrier amplifier 122 (second carrier amplifier), and the output-side winding 1411*b* (second output-side winding) which is electromagnetic-field coupled with the input-side winding 1411*a* (second input-side winding); the first capacitor 1412 (third capacitor), which is a capacitor electrically connected in parallel with the input-side winding 1411*a* (second input-side winding); and the second capacitor 1413 (fourth capacitor), which is a capacitor electrically connected in series between the output-side winding 1411*b* (second output-side winding) and the matching section 142. Accordingly, a small and broader-bandwidth Doherty amplifier can be realized, as well as its high efficiency can be realized.

Moreover, the converter 141*b* (second converter) of the combiner circuit 140 according to an exemplary embodiment of the present disclosure includes: the second transformer 1414 (third transformer) including an input-side winding 1414*a* (third input-side winding) of which one of two ends is electrically connected with the peak amplifier 131 (first peak amplifier) and the other end is electrically connected with the peak amplifier 132 (second peak amplifier), and the output-side winding 1414*b* (third output-side winding) which is electromagnetic-field coupled with the input-side winding 1414*a* (third input-side winding); the third capacitor 1415 (fifth capacitor), which is a capacitor electrically connected in parallel with the input-side winding 1414*a* (third input side winding); and the fourth capacitor 1416 (sixth capacitor), which is a capacitor electrically connected in parallel with the output-side winding 1414*b* (third output-side winding). Accordingly, a small and broader-bandwidth Doherty amplifier can be realized, as well as its high efficiency can be realized.

Also, the combiner circuit 140 according to an exemplary embodiment of the present disclosure is such that one of two ends of the output-side winding 1411*b* (second output-side winding) is electrically connected in series with the matching section 142 with the second capacitor 1413 (fourth capacitor) interposed therebetween. Then, the combiner circuit 140 further includes the capacitor 143 (seventh capacitor) electrically connected in series between the other end of the output-side winding 1411*b* (second output-side winding) and one of two ends of the output-side winding 1414*b* (third output-side winding). Accordingly, the characteristics of the combiner section 141 can be adjusted, thereby achieving yet broader bandwidth.

In addition, the combiner circuit 140 according to an exemplary embodiment of the present disclosure further includes the capacitor 144 (eighth capacitor) (see FIG. 2 to FIG. 4) electrically connected in series between the other end of the output-side winding 1414*b* (third output-side winding) and a reference potential. Accordingly, the characteristics of the combiner section 141 can be adjusted, thereby achieving yet broader bandwidth.

The embodiments described above are for ease of understanding the present disclosure and are not for limiting interpretation of the present disclosure. The present disclosure may be changed or improved without necessarily departing from its spirit, and the present disclosure also includes equivalents thereof. That is, design changes made to the embodiments as appropriate by those skilled in the art are also included in the scope of the present disclosure as long as they are provided with features of the present disclosure. The elements provided in the embodiments and the arrangement thereof are not limited to those illustrated, and can be changed as appropriate.

What is claimed is:

1. A combiner circuit comprising:

a combiner section configured to output a combined signal by combining a first signal output from a carrier amplifier circuit and a second signal output from a peak amplifier circuit, the first signal being generated by amplifying a first distribution signal distributed from an input signal, the second signal being generated by amplifying a second distribution signal distributed from the input signal; and a matching section connected in series with the combiner section and configured to receive the combined signal, wherein a variation coefficient of an imaginary part of an impedance associated with an increase in frequency of the input signal indicates a negative value, and the matching section is configured to match impedance between the combiner section and a load, wherein:

$$\frac{f_{max}+f_{min}}{2}=f_{in} \quad \text{equation (1)}$$

$$\frac{f_{max}-f_{min}}{f_{in}}\leq 0.491, \quad \text{equation (2)}$$

where a frequency of the input signal is a first frequency $f_{in}$, a lower limit frequency is a second frequency $f_{min}$, and an upper limit frequency is a third frequency $f_{max}$;

$$A=\frac{\dfrac{\mathrm{Re}\{Z_L(f_{max})\}-\mathrm{Re}\{Z_L(f_{min})\}}{R_{in}}}{\dfrac{f_{max}-f_{min}}{f_{in}}} \quad \text{equation (3)}$$

$$B=\frac{\dfrac{\mathrm{Im}\{Z_L(f_{max})\}-\mathrm{Im}\{Z_L(f_{min})\}}{R_{in}}}{\dfrac{f_{max}-f_{min}}{f_{in}}}, \quad \text{equation (4)}$$

where impedance when the load is viewed from an output side of the combiner section is $Z_L$, $R_{in}$ is a real part of the impedance at the first frequency $f_{in}$, $\mathrm{Re}\{ZL(f_{min})\}$ is a real part of the impedance $Z_L$ at the second frequency $f_{min}$, $\mathrm{Im}\{Z_L(f_{min})\}$ is an imaginary part of the impedance $Z_L$ at the second frequency $f_{min}$, $\mathrm{Re}\{Z_L(f_{max})\}$ is a real part of the impedance $Z_L$ at the third frequency $f_{max}$, $\mathrm{Im}\{Z_L(f_{max})\}$ is an imaginary part of the impedance $Z_L$ at the third frequency $f_{max}$, and A and B are coefficients; and $$-1.0[\text{non-}dim.]<A<1.0[\text{non-}dim.] \quad \text{equation (5)}$$

$$-19.0[\text{non-}dim.]<B<0.0[\text{non-}dim.]. \quad \text{equation (6)}$$

2. The combiner circuit according to claim 1, wherein the matching section comprises a low-pass filter comprising an inductor and a capacitor.

3. The combiner circuit according to claim 1, wherein the matching section comprises a bandpass filter having a first terminal electrically connected with the combiner section, and a second terminal electrically connected with an antenna on an opposite side of the combiner section.

4. The combiner circuit according to claim 1, wherein the matching section comprises:

a first transformer comprising a first input-side winding to which the combined signal is input, and a first output-side winding which is electromagnetic-field coupled with the first input-side winding;

a first capacitor connected in parallel with the first input-side winding; and a second capacitor connected in parallel with the first output-side winding.

5. The combiner circuit according to claim 1, wherein the carrier amplifier circuit forms a differential amplifier circuit with a first carrier amplifier and a second carrier amplifier.

6. The combiner circuit according to claim 5, wherein the peak amplifier circuit forms a differential amplifier circuit with a first peak amplifier and a second peak amplifier.

7. The combiner circuit according to claim 6, wherein the combiner section comprises:

a first converter electrically connected with an output terminal of each of the first carrier amplifier and the second carrier amplifier, the first converter being configured to convert impedance on an output side of the first carrier amplifier and the second carrier amplifier; and a second converter electrically connected with an output terminal of each of the first peak amplifier and the second peak amplifier, the second converter being configured to convert impedance on an output side of the first peak amplifier and the second peak amplifier.

8. The combiner circuit according to claim 7, wherein the first converter comprises:

a second transformer comprising a second input-side having a first end electrically connected with the first carrier amplifier and a second end electrically connected with the second carrier amplifier, and a second output-side winding which is electromagnetic-field coupled with the second input-side winding;

a third capacitor electrically connected in parallel with the second input-side winding; and a fourth capacitor electrically connected in series between the second output-side winding and the matching section.

9. The combiner circuit according to claim 8, wherein the second transformer comprises:

a third transformer comprising a third input-side winding having a first end electrically connected with the first peak amplifier and a second end electrically connected with the second peak amplifier, and a third output-side winding which is electromagnetic-field coupled with the third input-side winding;

a fifth capacitor electrically connected in parallel with the third input-side winding; and a sixth capacitor electrically connected in parallel with the third output-side winding.

10. The combiner circuit according to claim 9, wherein:

a first end of the second output-side winding is electrically connected in series with the matching section via the fourth capacitor, and the combiner circuit further comprises a seventh capacitor electrically connected in series between a second end of the second output-side winding and a first end of the third output-side winding.

11. The combiner circuit according to claim 10, further comprising:

an eighth capacitor electrically connected in series between a second end of the third output-side winding and a reference potential.

* * * * *